(12) United States Patent
Chen et al.

(10) Patent No.: US 11,217,552 B2
(45) Date of Patent: Jan. 4, 2022

(54) MULTI-CHIP INTEGRATED FAN-OUT PACKAGE

(71) Applicant: Taiwan Semiconductor Manufacturing Company, Ltd., Hsinchu (TW)

(72) Inventors: Jie Chen, New Taipei (TW); Hsien-Wei Chen, Hsinchu (TW)

(73) Assignee: Taiwan Semiconductor Manufacturing Company, Ltd., Hsin-Chun (TW)

( * ) Notice: Subject to any disclaimer, the term of this patent is extended or adjusted under 35 U.S.C. 154(b) by 157 days.

(21) Appl. No.: 16/586,531

(22) Filed: Sep. 27, 2019

(65) Prior Publication Data

US 2020/0027852 A1 Jan. 23, 2020

Related U.S. Application Data

(62) Division of application No. 16/052,277, filed on Aug. 1, 2018, now Pat. No. 10,515,922.

(Continued)

(51) Int. Cl.
*H01L 23/00* (2006.01)
*H01L 23/538* (2006.01)
(Continued)

(52) U.S. Cl.
CPC .......... *H01L 24/24* (2013.01); *H01L 21/4853* (2013.01); *H01L 21/565* (2013.01);
(Continued)

(58) Field of Classification Search
CPC ............. H01L 23/5385; H01L 23/5386; H01L 23/5389; H01L 24/19; H01L 24/24;
(Continued)

(56) References Cited

U.S. PATENT DOCUMENTS 8,703,542 B2 4/2014 Lin et al.
9,000,584 B2 4/2015 Lin et al.
(Continued)

FOREIGN PATENT DOCUMENTS

CN 101859752 A 10/2010
CN 102169875 A 8/2011
(Continued)

*Primary Examiner* — Thanhha S Pham
(74) *Attorney, Agent, or Firm* — Slater Matsil, LLP

(57) ABSTRACT

A method includes surrounding a die and a conductive pillar proximate the die with a molding material, where the die and the conductive pillar are disposed over a first side of a first redistribution structure, where a second side of the first redistribution structure opposing the first side is attached to a first carrier; bonding conductive pads disposed on a first surface of a pre-made second redistribution structure to the die and to the conductive pillar, where a second surface of the pre-made second redistribution structure opposing the first surface is attached to a second carrier; after bonding the conductive pads, removing the second carrier to expose conductive features of the pre-made second redistribution structure proximate the second surface; and forming conductive bumps over and electrically coupled to the conductive features of the pre-made second redistribution structure.

20 Claims, 15 Drawing Sheets

Related U.S. Application Data

(60) Provisional application No. 62/586,608, filed on Nov. 15, 2017.

(51) Int. Cl.
| | |
|---|---|
| *H01L 25/10* | (2006.01) |
| *H01L 25/00* | (2006.01) |
| *H01L 21/768* | (2006.01) |
| *H01L 21/56* | (2006.01) |
| *H01L 21/48* | (2006.01) |
| *H01L 21/683* | (2006.01) |
| *H01L 23/31* | (2006.01) |
| *H01L 21/3105* | (2006.01) |

(52) U.S. Cl.
CPC .... *H01L 21/6835* (2013.01); *H01L 21/76885* (2013.01); *H01L 23/5384* (2013.01); *H01L 23/5385* (2013.01); *H01L 23/5386* (2013.01); *H01L 23/5389* (2013.01); *H01L 24/05* (2013.01); *H01L 24/19* (2013.01); *H01L 24/20* (2013.01); *H01L 24/82* (2013.01); *H01L 25/105* (2013.01); *H01L 25/50* (2013.01); *H01L 21/31053* (2013.01); *H01L 23/3128* (2013.01); *H01L 2221/68345* (2013.01); *H01L 2221/68359* (2013.01); *H01L 2221/68381* (2013.01); *H01L 2224/04105* (2013.01); *H01L 2224/12105* (2013.01); *H01L 2224/16227* (2013.01); *H01L 2224/18* (2013.01); *H01L 2224/211* (2013.01); *H01L 2224/214* (2013.01); *H01L 2224/24226* (2013.01); *H01L 2224/24265* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2224/82005* (2013.01); *H01L 2224/97* (2013.01); *H01L 2225/0651* (2013.01); *H01L 2225/06568* (2013.01); *H01L 2225/1023* (2013.01); *H01L 2225/1035* (2013.01); *H01L 2225/1041* (2013.01); *H01L 2225/1058* (2013.01); *H01L 2924/15311* (2013.01)

(58) Field of Classification Search
CPC ....... H01L 24/25; H01L 24/82; H01L 25/105; H01L 25/115; H01L 25/117
See application file for complete search history.

(56) References Cited

U.S. PATENT DOCUMENTS

| | | | |
|---|---|---|---|
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,633,974 B2 | 4/2017 | Zhai et al. | |
| 2008/0116589 A1 | 5/2008 | Li et al. | |
| 2015/0221601 A1* | 8/2015 | Kim | H01L 23/5389 257/782 |
| 2016/0118333 A1 | 4/2016 | Lin | |
| 2016/0126220 A1 | 5/2016 | Chen et al. | |
| 2016/0276284 A1* | 9/2016 | Chen | H01L 23/49827 |
| 2016/0307872 A1 | 10/2016 | Chen et al. | |
| 2017/0084589 A1 | 3/2017 | Kuo et al. | |
| 2017/0098589 A1 | 4/2017 | Liu et al. | |

FOREIGN PATENT DOCUMENTS

| | | |
|---|---|---|
| CN | 103426846 A | 12/2013 |
| CN | 106057787 A | 10/2016 |
| CN | 106560917 A | 4/2017 |
| TW | 201705400 A | 2/2017 |
| TW | 201712828 A | 4/2017 |

* cited by examiner

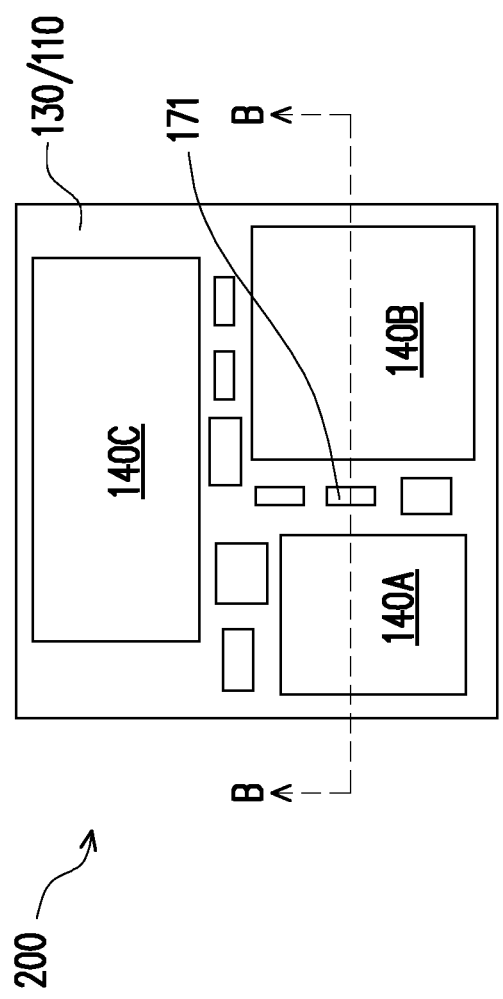

MULTI-CHIP INTEGRATED FAN-OUT PACKAGE

PRIORITY CLAIM AND CROSS-REFERENCE

This application is a divisional of U.S. patent application Ser. No. 16/052,277 filed Aug. 1, 2018, entitled "Multi-Chip Integrated Fan-Out Package," which claims priority to U.S. Provisional Patent Application No. 62/586,608 filed Nov. 15, 2017, entitled "Multi-Chip Integrated Fan-Out Package," which applications are hereby incorporated by reference in their entireties.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

An example of these packaging technologies is the Package-on-Package (POP) technology. In a PoP package, a top semiconductor packages is stacked on top of a bottom semiconductor package to allow high level of integration and component density. Another example is the Multi-Chip-Module (MCM) technology, where multiple semiconductor dies are packaged in one semiconductor package to provide semiconductor devices with integrated functionalities.

The high level of integration of advanced packaging technologies enables production of semiconductor devices with enhanced functionalities and small footprints, which is advantageous for small form factor devices such as mobile phones, tablets and digital music players. Another advantage is the shortened length of the conductive paths connecting the interoperating parts within the semiconductor package. This improves the electrical performance of the semiconductor device, since shorter routing of interconnections between circuits yields faster signal propagation and reduced noise and cross-talk.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 11A, 11B, and 12 illustrate various views of a semiconductor package at various stages of fabrication, in accordance with an embodiment.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor packages and methods of forming the semiconductor packages are provided in various embodiments. In some embodiments, the semiconductor package has a die embedded in a molding material, and redistribution structures (e.g., a backside redistribution structure and a front side redistribution structure) on opposing sides of the die. In some embodiments, the front side redistribution structure is pre-formed prior to being attached to the die. In some embodiment, at least the front side redistribution structure is formed using a damascene process(es), and as a result, finer pitches between conductive lines and higher reliability of the redistribution structure is achieved.

Figure 1:
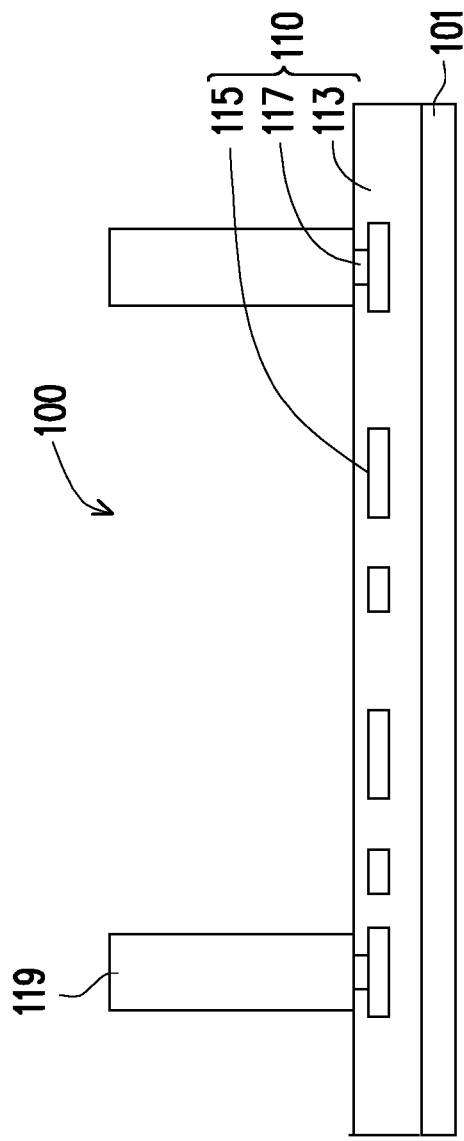
FIGS. 1-4, 5A, 5B, and 6-9 illustrate various views of a semiconductor package at various stages of fabrication, in accordance with an embodiment.

FIGS. 1-4, 5A, 5B, and 6-9 illustrate various views (e.g., cross-sectional view, plan view) of a semiconductor package 100 at various stages of fabrication, in accordance with an embodiment. In FIG. 1, a redistribution structure 110 is formed over a carrier 101. The redistribution structure 110 comprises conductive features (e.g., conductive lines and vias) formed in one or more dielectric layers. Conductive pillars 119 are formed over the upper surface of the redistribution structure 110 and are electrically coupled to the redistribution structure 110.

The carrier 101 may be made of a material such as glass, although other suitable material, such as silicon, polymer, polymer composite, metal foil, ceramic, glass epoxy, beryllium oxide, or tape may also be used. The redistribution structure 110 is formed over the carrier 101. The redistribution structure 110 comprises conductive features, such as one or more layers of conductive lines (e.g., 115) and vias (e.g., 117), and one or more dielectric layers (e.g., 113). For simplicity, the dielectric layer 113 is illustrated as one layer in FIG. 1, however, the dielectric layer 113 may comprise a plurality of dielectric layers, as one skilled in art readily appreciates.

In some embodiments, the one or more dielectric layers 113 are formed of a polymer, such as polybenzoxazole (PBO), polyimide, benzocyclobutene (BCB), or the like. In other embodiments, the one or more dielectric layers 113 are formed of a nitride such as silicon nitride, an oxide such as silicon oxide, phosphosilicate glass (PSG), borosilicate glass (BSG), boron-doped phosphosilicate glass (BPSG), or the like. The one or more dielectric layers 113 may be formed by any acceptable deposition process, such as spin coating, chemical vapor deposition (CVD), laminating, the like, or a combination thereof.

In some embodiments, the conductive features of the redistribution structure 110 comprise conductive lines (e.g., 115), conductive vias (e.g., 117) formed of a suitable conductive material such as copper, titanium, tungsten, aluminum, or the like. In some embodiments, the conductive features are formed by forming openings in a dielectric layer of the redistribution structure 110 to expose underlying conductive features, forming a seed layer (not shown) over the dielectric layer and in the openings, forming a patterned photoresist (not shown) with a designed pattern over the seed layer, plating (e.g., electroplating or electroless plating) the conductive material in the designed pattern and over the seed layer, and removing the photoresist and portions of seed layer on which the conductive material is not formed.

In some embodiments, an adhesive layer (not shown) is deposited or laminated over the carrier 101 before the redistribution structure 110 is formed. The adhesive layer may be photosensitive and may be easily detached from the carrier 101 by, e.g., shining an ultra-violet (UV) light on the carrier 101 in a subsequent carrier de-bonding process. For example, the adhesive layer may be a light-to-heat-conversion (LTHC) coating made by 3M Company of St. Paul, Minn.

Still referring to FIG. 1, conductive pillars 119 are formed over the redistribution structure 110. The conductive pillars 119 may be formed by: forming a seed layer over the redistribution structure 110; forming a patterned photoresist over the seed layer, where each of the openings in the patterned photoresist corresponds to a location of the conductive pillar 119 to be formed; filling the openings with an electrically conductive material such as copper using, e.g., electroplating or electroless plating; removing the photoresist using, e.g., an ashing or a stripping process; and removing portions of the seed layer on which the conductive pillars 119 are not formed.

Figure 2:
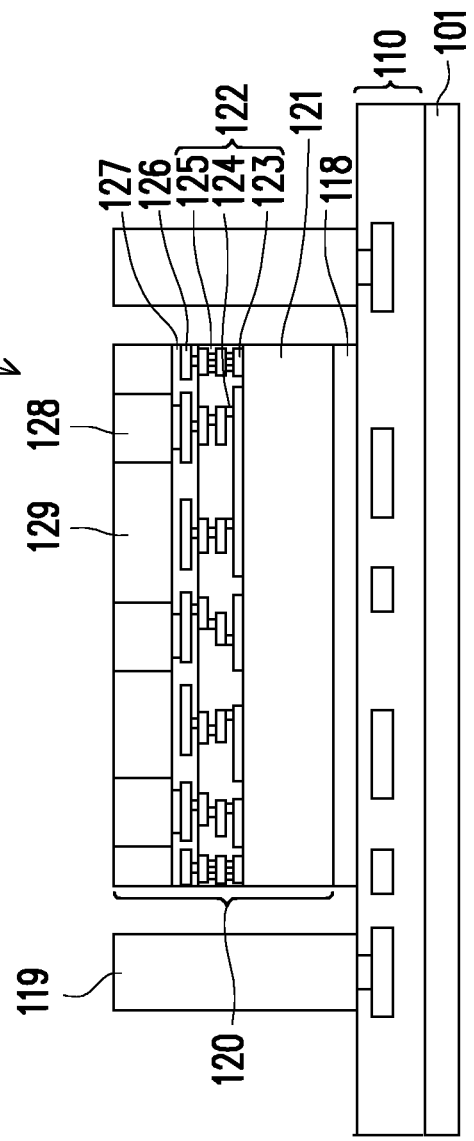

Next, in FIG. 2, a semiconductor die 120 (may also be referred to a die, or an integrated circuit (IC) die) is attached to the upper surface of the redistribution structure 110. An adhesive film 118, such as a die attaching film (DAF), may be used to attach the die 120 to the redistribution structure 110. Since the backside of the die 120 is attached to the redistribution structure 110, the redistribution structure 110 may also be referred to as a backside redistribution structure.

Before being adhered to the redistribution structure 110, the dies 120 may be processed according to applicable manufacturing processes to form integrated circuits in the die 120. For example, the die 120 may include a semiconductor substrate 121, such as silicon, doped or undoped, or an active layer of a semiconductor-on-insulator (SOI) substrate. The semiconductor substrate 121 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices (not shown), such as transistors, diodes, capacitors, resistors, etc., may be formed in and/or on the semiconductor substrate 121 and may be interconnected by interconnect structures 122 comprising, for example, metallization patterns (e.g., conductive lines 123 and vias 124) in one or more dielectric layers 125 on the semiconductor substrate 121 to form an integrated circuit.

The interconnect structures 122 are formed using damascene and/or dual-damascene process, in some embodiments.

The dies 120 further comprise pads 126, such as aluminum pads, to which external connections are made. The pads 126 are on what may be referred to as active side or front side of the die 120. Passivation film(s) 127 is formed on the die 120 and on portions of the pads 126. Openings are through the passivation film(s) 127 to the pads 126. Die connectors 128, such as conductive pillars (for example, comprising a metal such as copper), extend into the openings of the passivation film(s) 127 and are mechanically and electrically coupled to the respective pads 126. The die connectors 128 may be formed by, for example, plating, or the like. The die connectors 128 are electrically coupled to the integrated circuits of the die 120.

A dielectric material 129 is formed on the active sides of the die 120, such as on the passivation film(s) 127 and/or the die connectors 128. The dielectric material 129 laterally encapsulates the die connectors 128, and the dielectric material 129 is laterally coterminous with the die 120. The dielectric material 129 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; or a combination thereof, and may be formed, for example, by spin coating, lamination, CVD, or the like.

Figure 3:
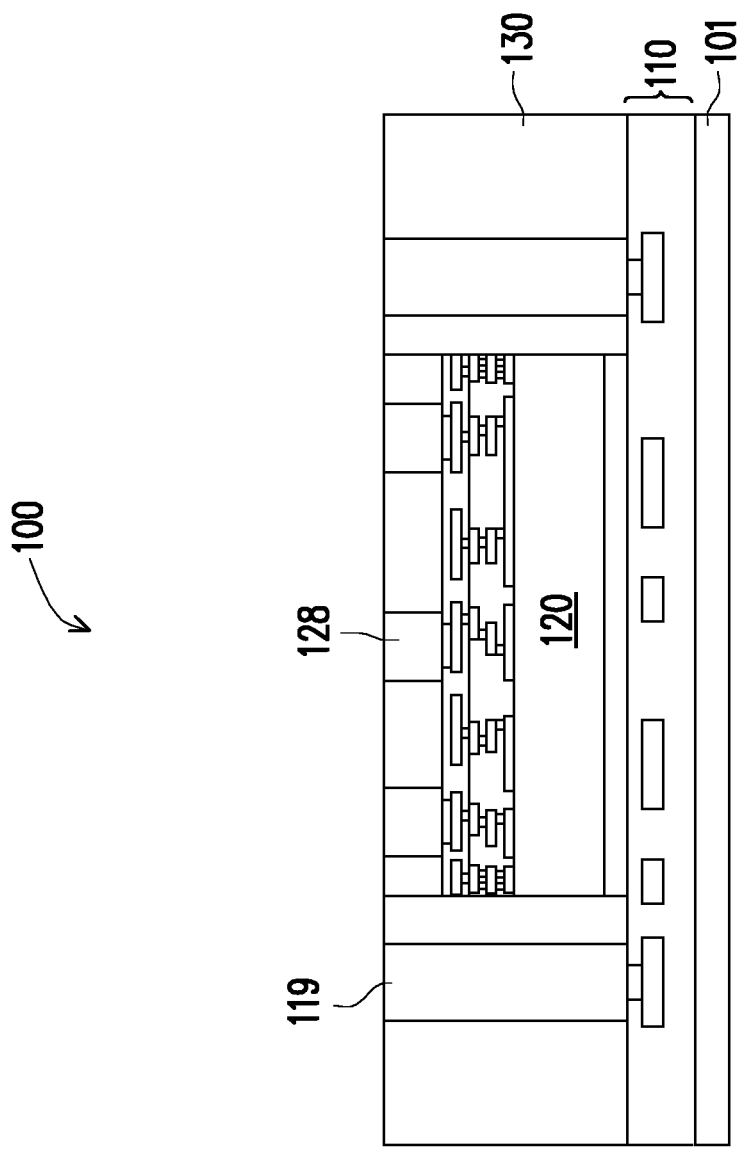

Next, in FIG. 3, a molding material 130 is formed over the redistribution structure 110, around the die 120 and around the conductive pillars 119. The molding material 130 may comprise an epoxy, an organic polymer, a polymer with or without a silica-based or glass filler added, or other materials, as examples. In some embodiments, the molding material 130 comprises a liquid molding compound (LMC) that is a gel type liquid when applied. The molding material 130 may also comprise a liquid or solid when applied. Alternatively, the molding material 130 may comprise other insulating and/or encapsulating materials. The molding material 130 is applied using a wafer level molding process in some embodiments. The molding material 130 may be molded using, for example, compressive molding, transfer molding, or other methods.

Next, the molding material 130 is cured using a curing process, in some embodiments. The curing process may comprise heating the molding material 130 to a predetermined temperature for a predetermined period of time, using an anneal process or other heating process. The curing process may also comprise an ultra-violet (UV) light exposure process, an infrared (IR) energy exposure process, combinations thereof, or a combination thereof with a heating process. Alternatively, the molding material 130 may be cured using other methods. In some embodiments, a curing process is not included.

Next, a planarization process, such as chemical and mechanical polish (CMP), may be performed to remove excess portions of the molding material 130 over the front side of the die 120. After the planarization process, the molding material 130, the conductive pillar 119, and the die connectors 128 have a coplanar upper surface, in some embodiments.

Figure 4:
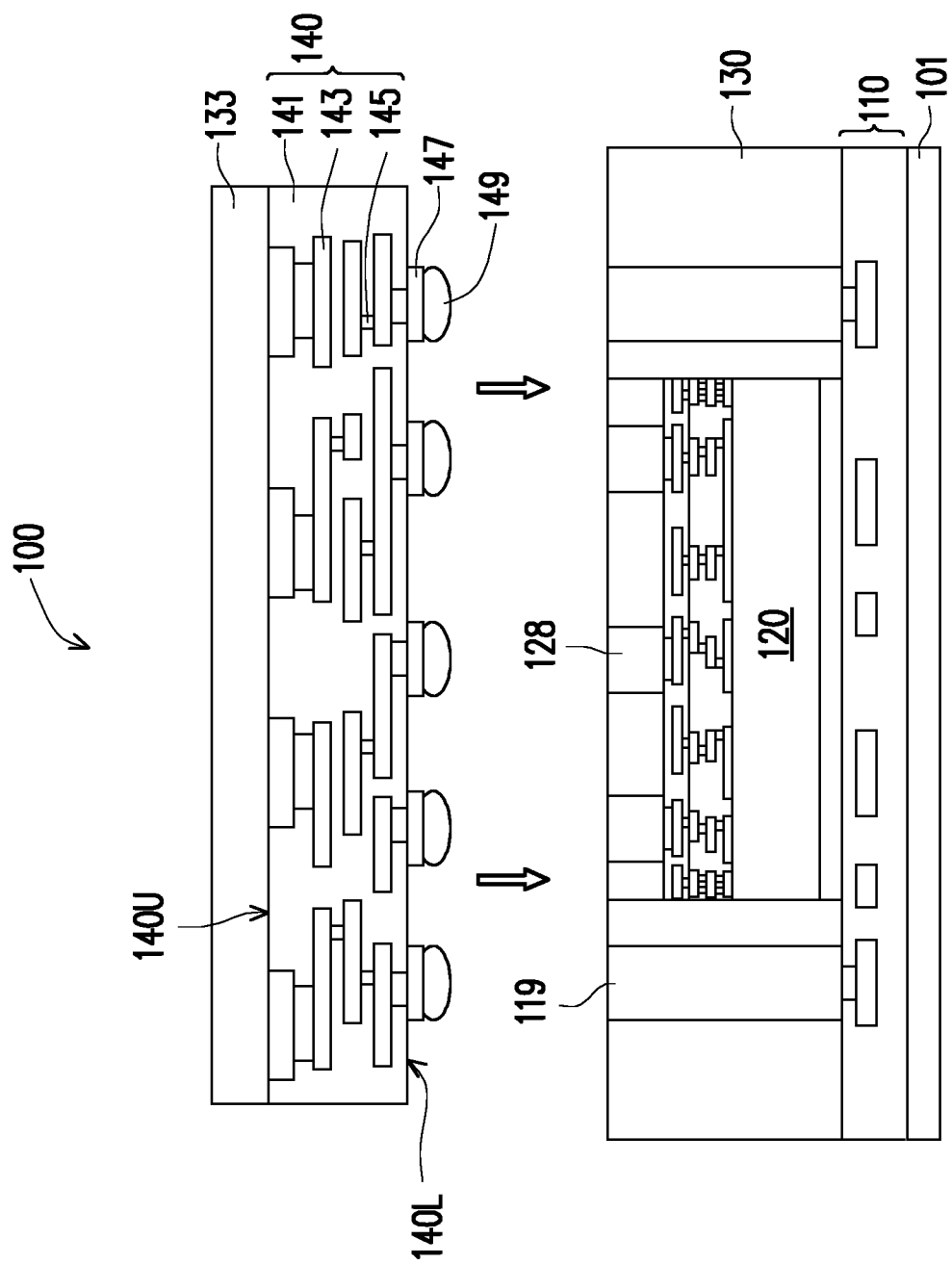

Referring next to FIG. 4, a pre-formed redistribution structure 140 is attached to the semiconductor package 100 shown in FIG. 3. The redistribution structure 140 is formed on a carrier 133 prior to being attached to the semiconductor package 100, in the illustrated example of FIG. 4. The redistribution structure 140 comprises one or more layers of electrically conductive features (e.g., conductive lines 143, vias 145) formed in one or more dielectric layer 141. The carrier 133 may be formed of silicon (e.g., bulk silicon), although other suitable material may also be used for the carrier 133. Although not shown, an adhesion layer, such as an LTHC film, may be formed on the carrier 133 before the redistribution structure 140 is formed.

As illustrated in FIG. 4, a first side 140U of the redistribution structure 140 is attached to the carrier 133, and conductive pads 147 (e.g., copper pads) are formed on a second side 140L of the redistribution structure 140 opposing the first side 140U, which conductive pads 147 are electrically coupled to the conductive features of the redistribution structure 140. Solder regions 149 (e.g., solder paste) may be formed over the conductive pads 147. Although not illustrated in FIG. 4, solder regions (e.g., solder paste) may also be formed over the upper surface of the conductive pillars 119 and over the upper surface of the die connectors 128. The solder regions will be used to form solder joints between the redistribution structure 140 and the conductive pillars 119/die connectors 128 in a subsequent reflow process, in various embodiments. Since the redistribution structure 140 is bonded to the front side of the die 120, the redistribution structure 140 may also be referred to as the front side redistribution structure.

In some embodiments, the redistribution structure 140 is formed over the carrier 133 using a same or similar formation method as forming the interconnect structures (e.g., 122 in FIG. 2) in a semiconductor die. In particular, damascene process and/or dual-damascene process are used in forming the redistribution structure 140. In an embodiment damascene process, a dielectric layer is formed over the carrier 133 using a suitable deposition method such as chemical vapor deposition (CVD). Once the dielectric layer is formed, openings, such as trenches, are formed in the dielectric layer using, e.g., photolithography and etching processes. Next, a barrier layer, which may comprise titanium (Ti), tantalum (Ta), titanium nitride (TiN), tantalum nitride (TaN), the like, or a combination thereof, is deposited by sputtering, physical vapor deposition (PVD), or the like, in the openings. A seed layer, which may comprise copper (Cu), Ti, Ta, TiN, TaN, or a combination thereof, is then formed over the barrier layer. Next, a fill metal, such as copper, is formed in the openings and over the seed layer by, e.g., an electroplating process or an electroless plating process. The fill metal may overfill the openings and may be formed over the upper surface the dielectric layer. A planarization process, such as CMP, is then performed to remove excess portions of the fill metal, excess portions of the barrier layer, and excess portions of the seed layer outside the openings. The remaining conductive materials within the openings form the conductive features (e.g., one layer of the conductive features) of the redistribution structure 140. In a dual-damascene process, each trench may have an upper trench and a lower trench, with the upper trench corresponding to a location of a conductive line and the lower trench corresponding to a location of a via. The upper trench and the low trench are then filled by the fill metal in a same processing step, with the upper trench filled to form the conductive line and the lower trench filled to form the via. Barrier layer and seed layer may be formed in the upper trench and the lower trench, similar to the processing of the damascene process.

By forming the redistribution structure 140 over the carrier 133, the damascene process and/or the dual-damascene process could be used to form the front side redistribution structure 140. In contrast, it may not be possible to use the damascene process or the dual-damascene process to form the front side redistribution structures 140 without the presently disclosed method. As an example, consider a case where a front side redistribution structure is formed layer by layer over the molding material 130 and over the die 120, after the processing illustrated in FIG. 3. The molding material 130, which may comprise an organic compound such as polymer, may not be able to withstand the high temperature (e.g., over 400° C.) associated with the CVD deposition process used in the damascene/dual-damascene process. Therefore, damascene/dual-damascene process may not be an option for forming the front side redistribution structure over the molding material 130. The present disclosure, by forming the redistribution structure 140 over the carrier 133 that is more tolerant to high temperature than the molding material 130, overcomes the thermal budget limitation of the molding material 130, thus allowing the damascene/dual-damascene process to be used for forming the redistribution structure 140.

In some embodiments, the redistribution structure 140 formed using the damascene/dual-damascene process achieves finer pitches between conductive lines than what is achieved by formation methods that form the redistribution structure over the molding material 130 without using the damascene/dual-damascene process. In addition, the size of the vias formed using the damascene/dual-damascene process is also smaller, allowing for higher integration density. Additionally, by forming the redistribution structure 140 beforehand, e.g., at a different location, and/or before attaching the redistribution structure 140 to the semiconductor package, the processing time for forming the final product can be reduced, thus increasing the throughput of the production.

In accordance with some embodiments, prior to attaching the redistribution structure 140 to the conductive pillars 119/die connectors 128, testing of the die 120 is performed to confirm that the die 120 is a known good die (KGD). The pre-formed redistribution structures 140 are only attached to the KGDs, and dies that fail the functional testing are not attached with a redistribution structure 140. This saves production cost and improves the integrated yield of the manufacturing process.

Figure 5A:
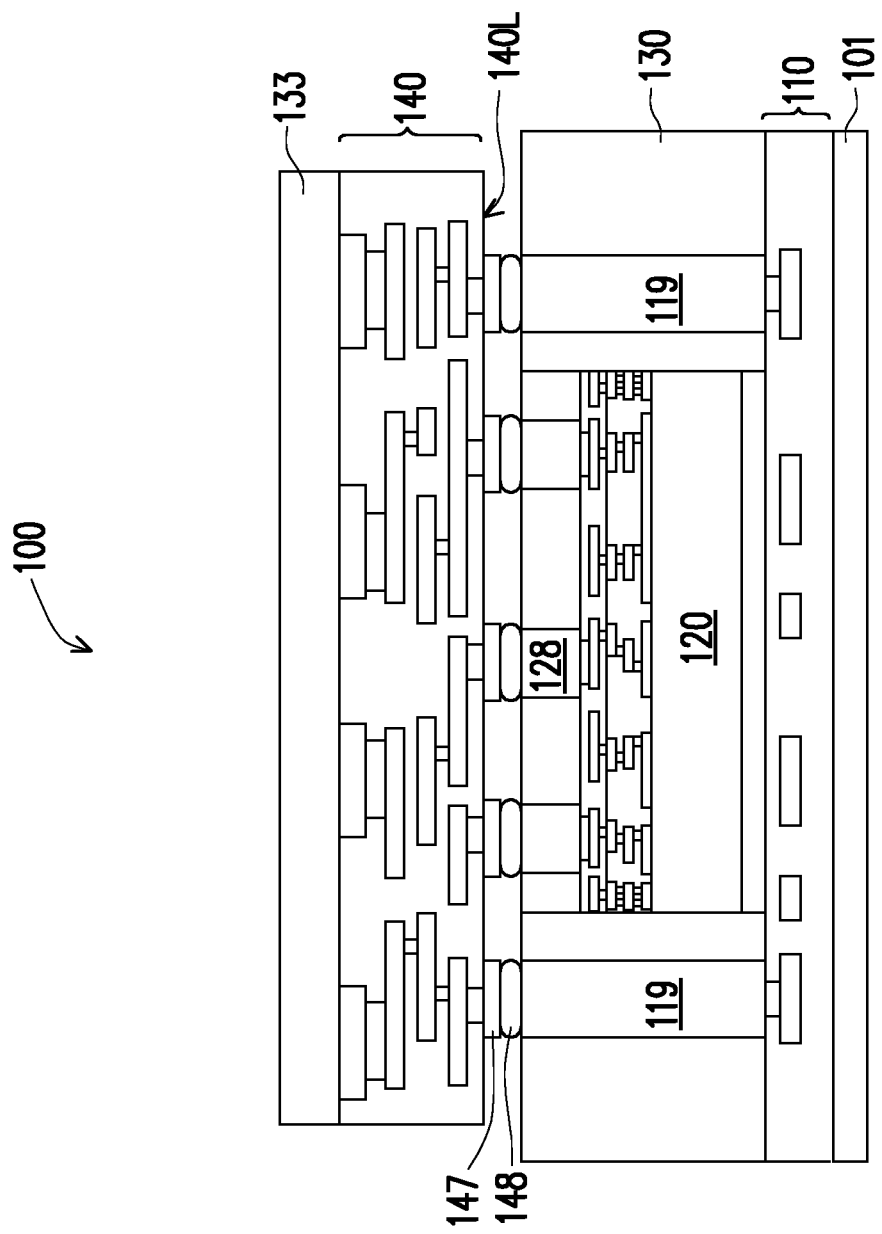

Next, as illustrated in FIG. 5A, a reflow process is performed to bond conductive pads 147 on the second side 140L of the redistribution structure 140 to the conductive pillars 119 and to the die connectors 128. Solder regions 148 are formed between the conductive pads 147 and the conductive pillars 119, and between the conductive pads 147 and the die connectors 128. After being bonded, the redistribution structure 140 is electrically coupled to the die 120 and to the redistribution structure 110. As illustrated in FIG. 5A, the semiconductor package 100 now includes the redistribution structure 140. Due to the solder regions 148 and the conductive pads 147, there is a gap between the redistribution structure 140 and the molding material 130. In other words, the second side 140L of the redistribution structure 140, which is a surface of the redistribution structure 140 closest to the molding material 130, is spaced apart from a surface of the molding material 130 facing the redistribution structure 140.

Figure 5B:
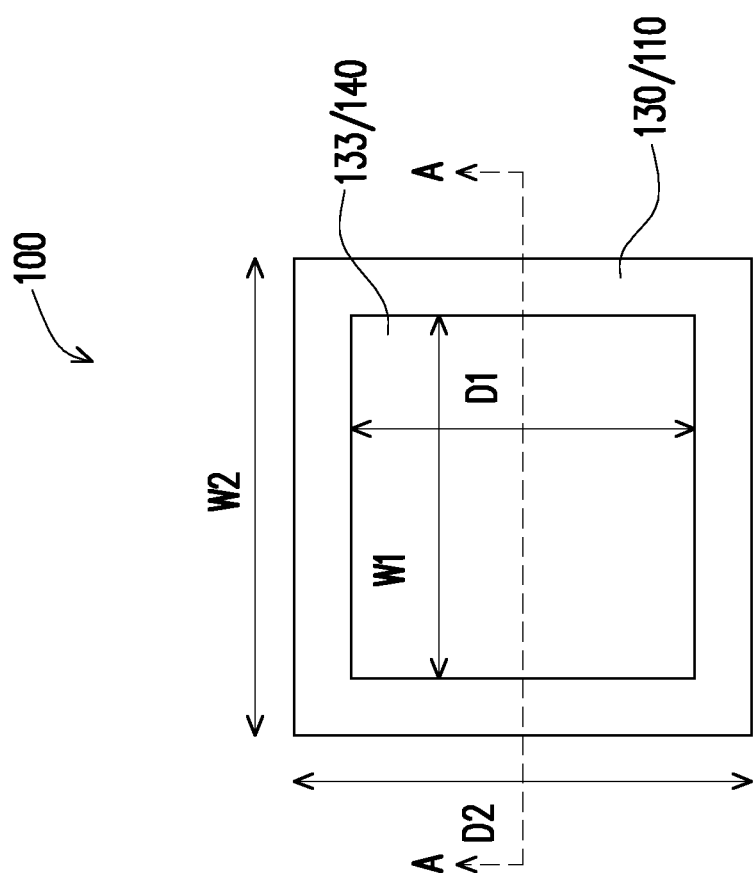

FIG. 5B illustrates a plan view of the semiconductor package 100 of FIG. 5A, and FIG. 5A is a cross-sectional view along line A-A in FIG. 5B. In the example of FIGS. 5A and 5B, each carrier 133 has a single redistribution structure (e.g., 140) formed thereon. The carrier 133 and the redistribution structure 140 may have a same size in the plan view of FIG. 5B, therefore, boundaries of the carrier 133 overlap with the boundaries of the redistribution structure 140 as illustrated in FIG. 5B. In addition, the molding material 130 and the redistribution structure 110 may have a same size in the plan view of FIG. 5B, and therefore, boundaries of the molding material 130 overlap with the boundaries of the redistribution structure 110. In some embodiments, multiple semiconductor packages 100 are formed on the carrier 101 simultaneously and will be singulated (e.g., by a dicing process) in subsequent processing to form a plurality of individual semiconductor packages, in which case the boundaries of molding material 130 and the boundaries of the redistribution structure 110 correspond to the respective boundaries of an individual semiconductor package 100 after the dicing process.

In some embodiments, a width $W_1$ of the redistribution structure 140 is smaller than a width $W_2$ of the molding material 130. In some embodiments, a depth $D_1$ of the redistribution structure 140 is smaller than a depth $D_2$ of the molding material 130. The redistribution structure 140 is disposed within the boundaries of the molding material 130 (and within the boundaries of the redistribution structure 110), as illustrated in FIG. 5B.

Figure 6:
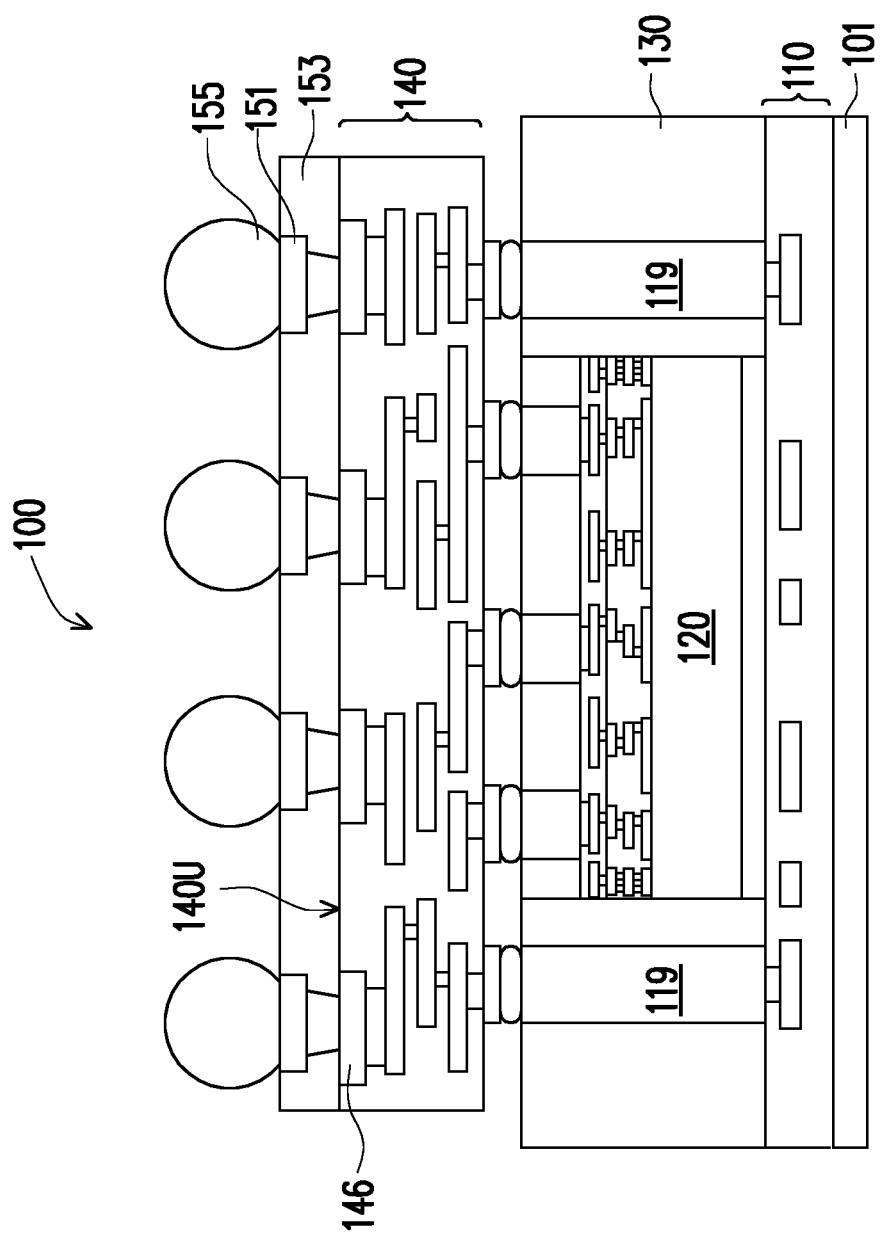

Next, in FIG. 6, the carrier 133 is de-bonded from the redistribution structure 140 by a suitable process, such as etching, grinding, or mechanical peel off. In an embodiment where an adhesive layer (, e.g., an LTHC film) is formed between the carrier 133 and the redistribution structure 140, the carrier 133 is de-bonded by shining a laser or UV light over the surface of the carrier 133. The laser or UV light breaks the chemical bonds of the adhesive layer that binds to the carrier 133, and the carrier 133 can then be easily detached.

After the carrier 133 is de-bonded, the first side 140U of the redistribution structure 140 is exposed. Next, a passivation layer 153 is formed over the first side 140U. The passivation layer 153 may be made of one or more suitable dielectric materials such as PBO, although any suitable material, such as polyimide or a polyimide derivative, may alternatively be utilized. The passivation layer 153 may be formed using, e.g., a spin-coating process, although any suitable method may alternatively be used.

Next, openings are formed in the passivation layer 153 to expose conductive features 146 at the first side 140U of the redistribution structure 140. After the openings are formed, under bump metallization (UBM) structures 151 may be formed in electrical contact with the conductive features 146. In an embodiment, the UBM structures 151 comprise three layers of conductive materials, such as a layer of titanium, a layer of copper, and a layer of nickel. However, there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBM structures 151. Any suitable materials or layers of material that may be used for the UBM structures 151 are fully intended to be included within the scope of the present disclosure.

The UBM structures 151 may be created by forming each layer over the passivation layer 153 and along the interior of the openings through the passivation layer 153 to the conductive features 146. The forming of each layer may be performed using a plating process, such as electrochemical plating, although other processes of formation, such as sputtering, evaporation, or PECVD process, may alternatively be used depending upon the materials used. Once the layers of the UBM structures have been formed, a suitable photolithographic and/or etching process(es) may be performed to remove portions of the layers and to leave the UBM structure 151 in a designed shape, such as a circular, octagonal, square, or rectangular shape, although any suitable shape may alternatively be formed.

Next, external connectors 155 are formed on the UBM structures 151. In an embodiment, the external connectors 155 are contact bumps such as controlled collapse chip connection (C4) bumps and comprise a material such as tin, or other suitable materials, such as silver or copper. In an embodiment in which the external connectors 155 are tin solder bumps, the external connectors 155 may be formed by initially forming a layer of tin through any suitable method such as evaporation, electroplating, printing, solder transfer, ball placement, or the like. Once a layer of tin has been formed on the structure, a reflow is performed in order to shape the material into the bump shape with a diameter, e.g., of about 80 μm.

However, while the external connectors 155 have been described above as C4 bumps, these are merely intended to be illustrative and are not intended to limit the embodiments. Rather, any suitable type of external contacts, such as ball grid arrays (BGAs), microbumps, copper pillars, a copper layer, a nickel layer, a lead free (LF) layer, an electroless nickel electroless palladium immersion gold (ENEPIG) layer, a Cu/LF layer, a Sn/Ag layer, a Sn/Pb, combinations of these, or the like, may alternatively be utilized. Any suitable external connector, and any suitable process for forming the external connectors, may be utilized for the external connectors 155, and all such external connectors are fully intended to be included within the scope of the embodiments.

Figure 7:
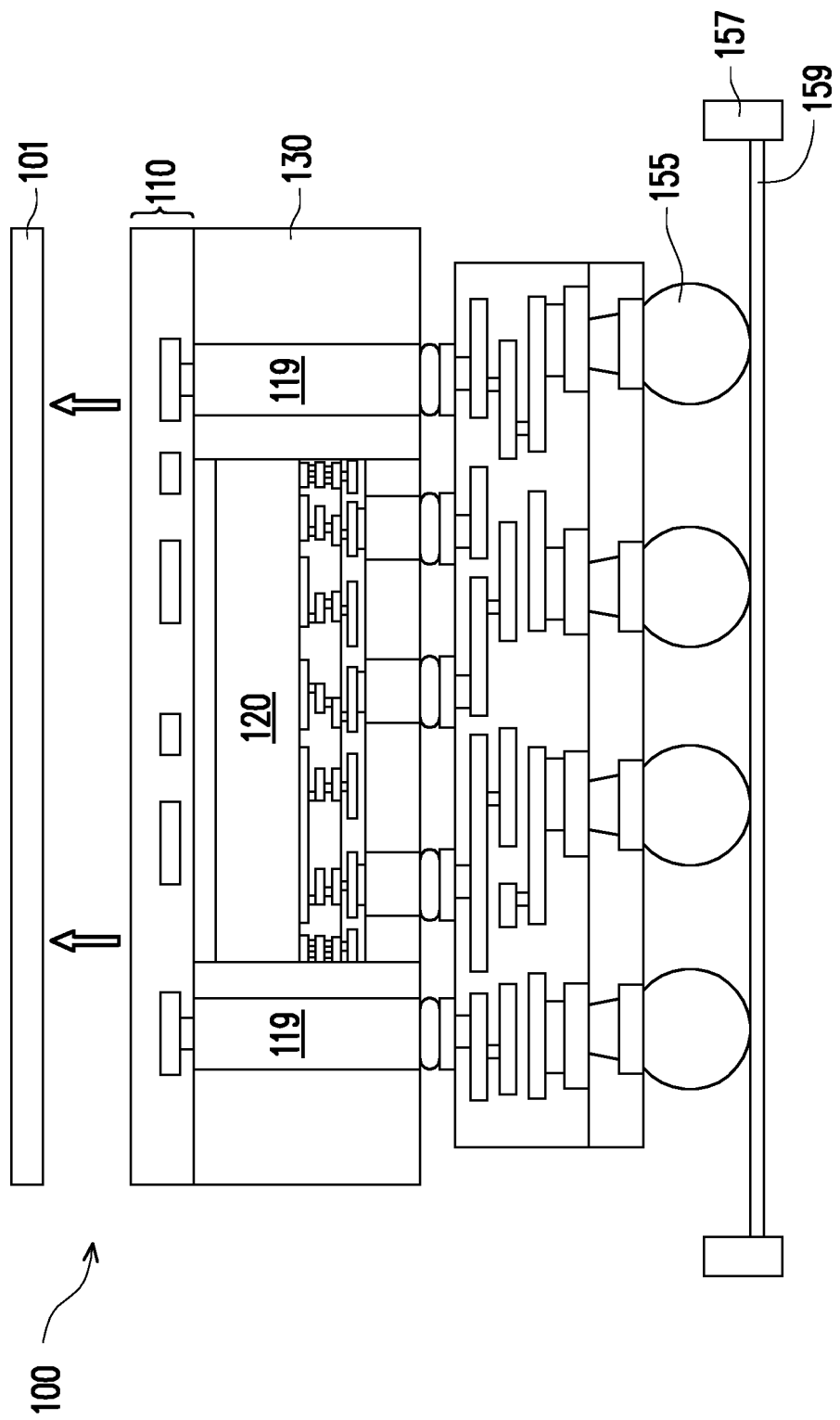

Next, in FIG. 7, the semiconductor package 100 is flipped over, and the external connectors 155 are attached to a tape 159 supported by a frame 157. The tape 159 may be a dicing tape, which may be adhesive, for holding the semiconductor package 100 in place in subsequent processing. Next, the carrier 101 is de-bonded from the semiconductor package 100 through a de-bonding process. The de-bonding process may remove the carrier 101 using any suitable process, such as etching, grinding, and mechanical peel off. In embodiments where an adhesive layer such as LTHC film is used between the carrier 101 and the redistribution structure 110, the carrier 101 is de-bonded by shining a laser or UV light over the surface of the carrier 101. The laser or UV light breaks the chemical bonds of the adhesive layer that binds to the carrier 101, and the carrier 101 can then be easily detached.

Figure 8:
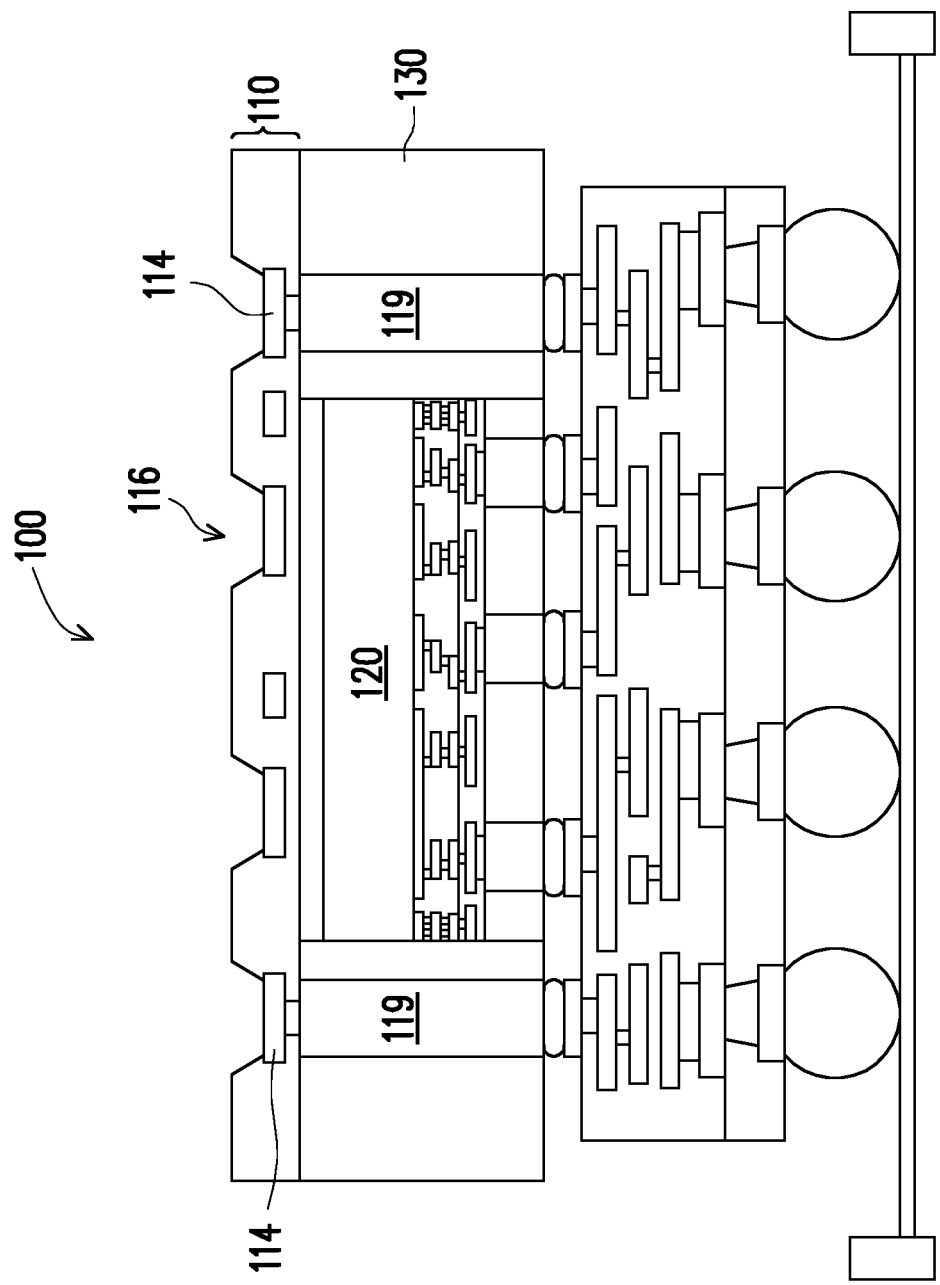

Next, in FIG. 8, openings 116 are formed in the dielectric layer of the redistribution structure 110 to expose conductive features 114 (e.g., conductive pads) of the redistribution structure 110. A laser drilling process, a photolithography and/or etching process, or the like, may be used to form the openings 116.

Figure 9:
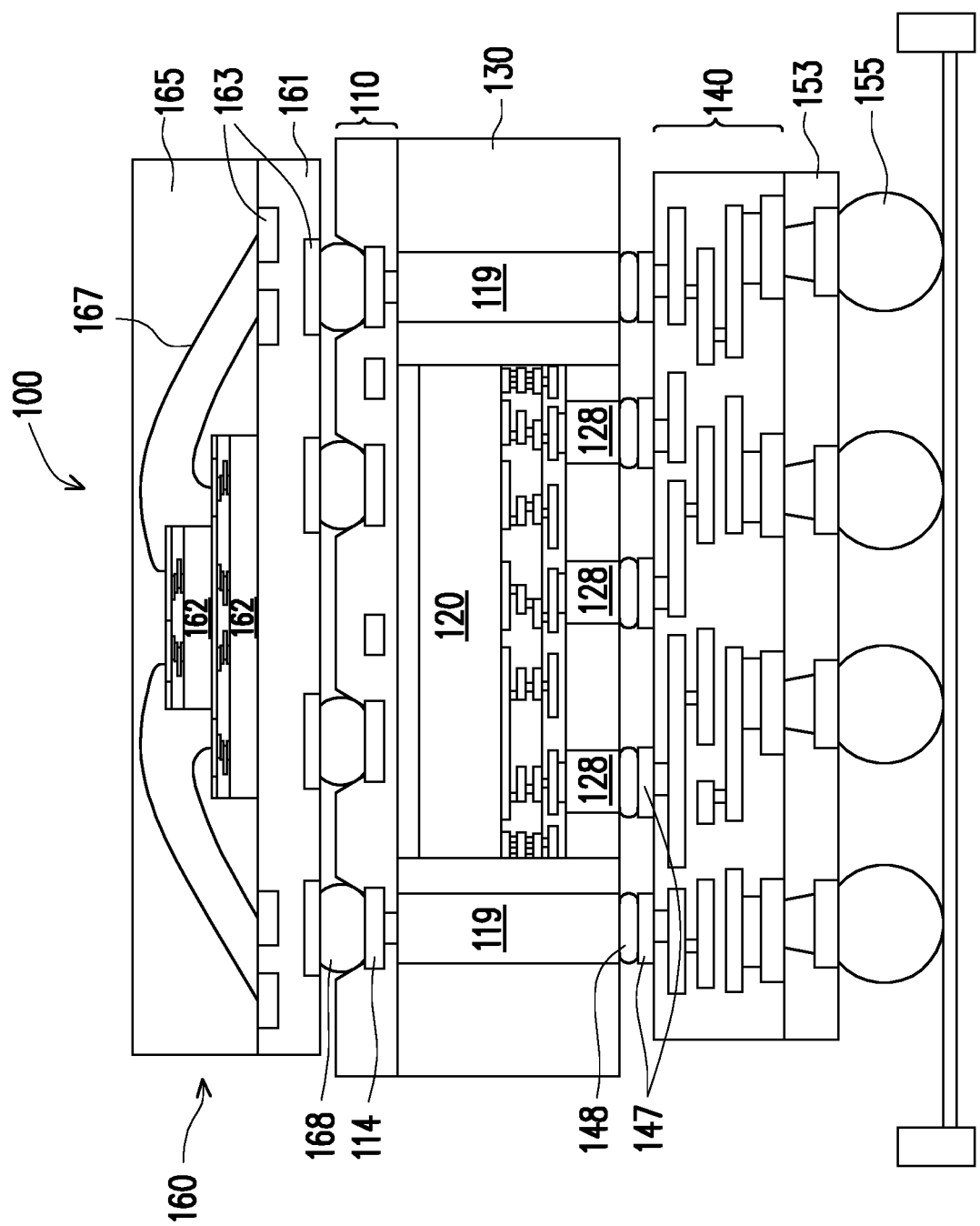

Referring next to FIG. 9, a semiconductor package 160, such as a package comprising memory devices, is attached to the semiconductor package 100 shown in FIG. 8 to form the semiconductor package 100 in FIG. 9, thereby forming a semiconductor package 100 with a package-on-package (PoP) structure.

As illustrated in FIG. 9, the semiconductor package 160 has a substrate 161 and one or more semiconductor dies 162 (e.g., memory dies) attached to an upper surface of the substrate 161. In some embodiments, the substrate 161 includes silicon, gallium arsenide, silicon on insulator ("SOI") or other similar materials. In some embodiments, the substrate 161 is a multiple-layer circuit board. In some embodiments, the substrate 161 includes bismaleimide triazine (BT) resin, FR-4 (a composite material composed of woven fiberglass cloth with an epoxy resin binder that is flame resistant), ceramic, glass, plastic, tape, film, or other supporting materials. The substrate 161 may include conductive features (e.g., conductive lines and vias, not shown) formed in/on the substrate 161. As illustrated in FIG. 9, the substrate 161 has conductive pads 163 formed on the upper surface and a lower surface of the substrate 161, which conductive pads 163 are electrically coupled to the conductive features of the substrate 161. The one or more semiconductor dies 162 are electrically coupled to the conductive pads 163 by, e.g., bonding wires 167. A molding material 165, which may comprise an epoxy, an organic polymer, a polymer, or the like, is formed over the substrate 161 and around the semiconductor dies 162. The molding material 165 is conterminous with the substrate 161, as illustrated in FIG. 9.

The semiconductor package 160 is electrically and mechanically coupled to the redistribution structure 110 by conductive joints 168, which may be formed by bonding external connectors of the semiconductor package 160 with the conductive feature 114 of the redistribution structure 110. In some embodiments, the conductive joints 168 comprise solder regions, conductive pillars (e.g., copper pillars with solder regions on end surfaces of the copper pillars), or any other suitable conductive joints.

Although not shown, a dicing processing may be performed after the conductive joints 168 are formed to separate the semiconductor package 100 from other neighboring semiconductor packages (not shown) formed in the same processing steps, thereby forming a plurality of individual semiconductor packages 100.

Figure 10:
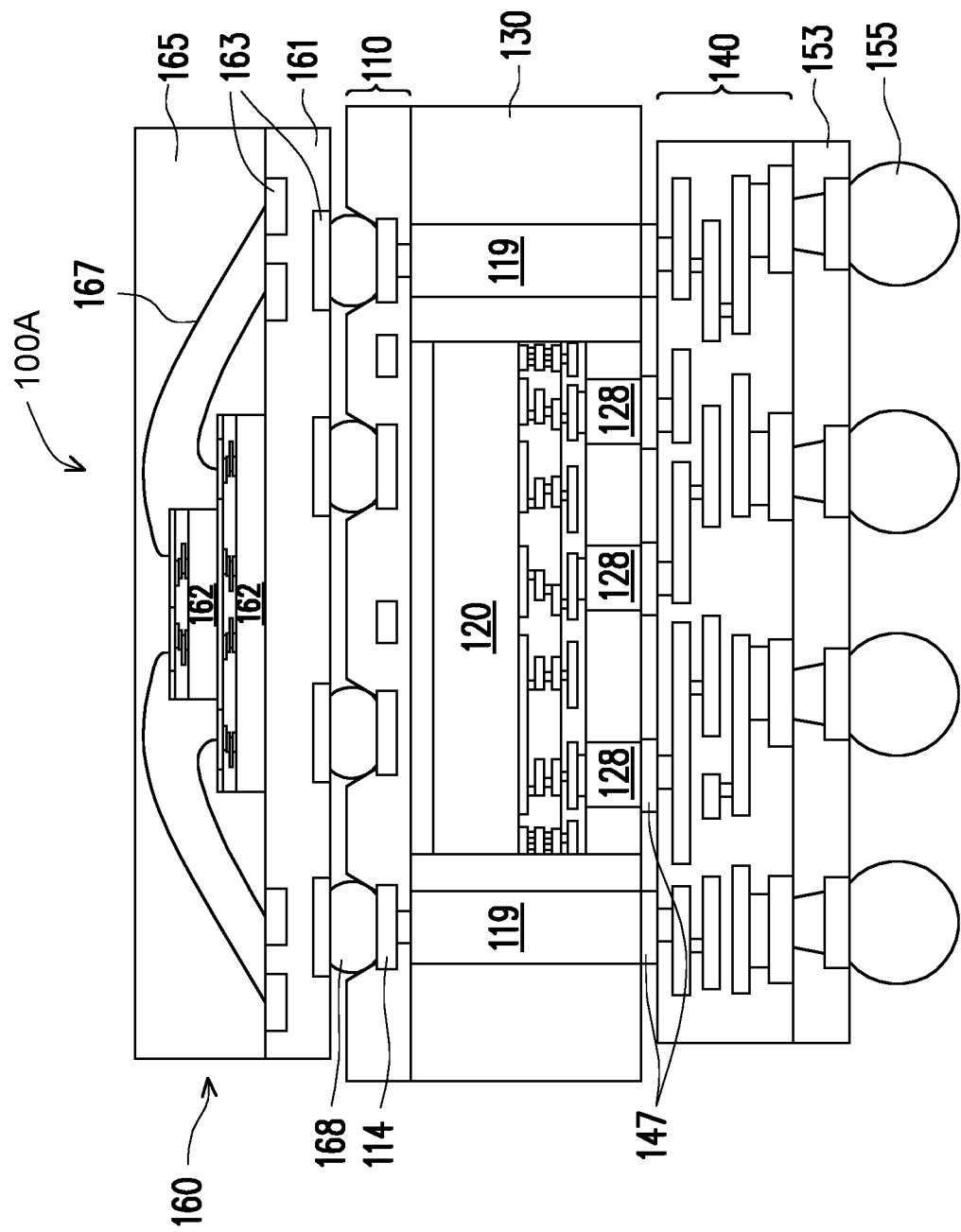
FIG. 10 illustrates a cross-sectional view of a semiconductor package, in accordance with an embodiment.

FIG. 10 illustrates a cross-sectional view of a semiconductor package 100A that is similar to the semiconductor package 100 of FIG. 9, and may be formed using similar processing as illustrated in FIGS. 1-9, but without the solder regions 148 (see FIG. 9) between the redistribution structure 140 and the conductive pillars 119/die connectors 128, in some embodiments. Unless otherwise specified, similar numerals in FIG. 10 refer to similar parts in FIGS. 1-9. For example, components with the same numerals may be formed of the same or similar material, and may be formed using the same or similar formation method. For simplicity, details are not repeated.

Referring to FIG. 10, to bond the redistribution structure 140 to the conductive pillars 119/die connectors 128, a direct-bonding process is performed so that the conductive pads 147 (e.g., a copper pad) is directly bonded to the conductive pillar 119 (e.g., a copper pillar) and directly bonded to the die connectors 128 (e.g., copper die connectors). Therefore, there is no solder region between the conductive pads 147 and the conductive pillars 119/die connectors 128. As illustrated in FIG. 10, due to the conductive pads 147 disposed in between, there is a gap between the redistribution structure 140 and the molding material 130. In other words, the second side 140L of the redistribution structure 140 is spaced apart from a surface of the molding material 130 facing the redistribution structure 140.

Figure 11A:
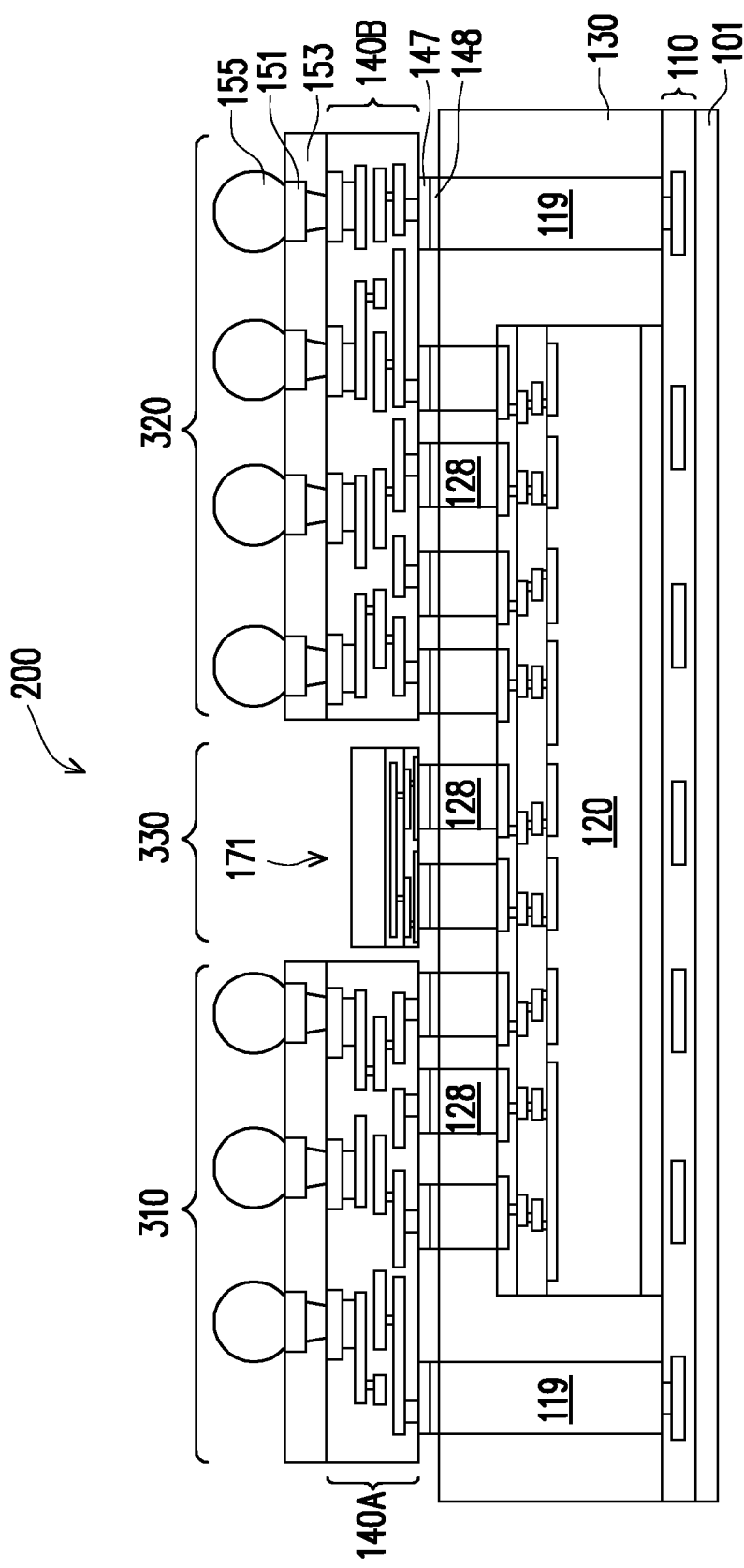
Figure 12:
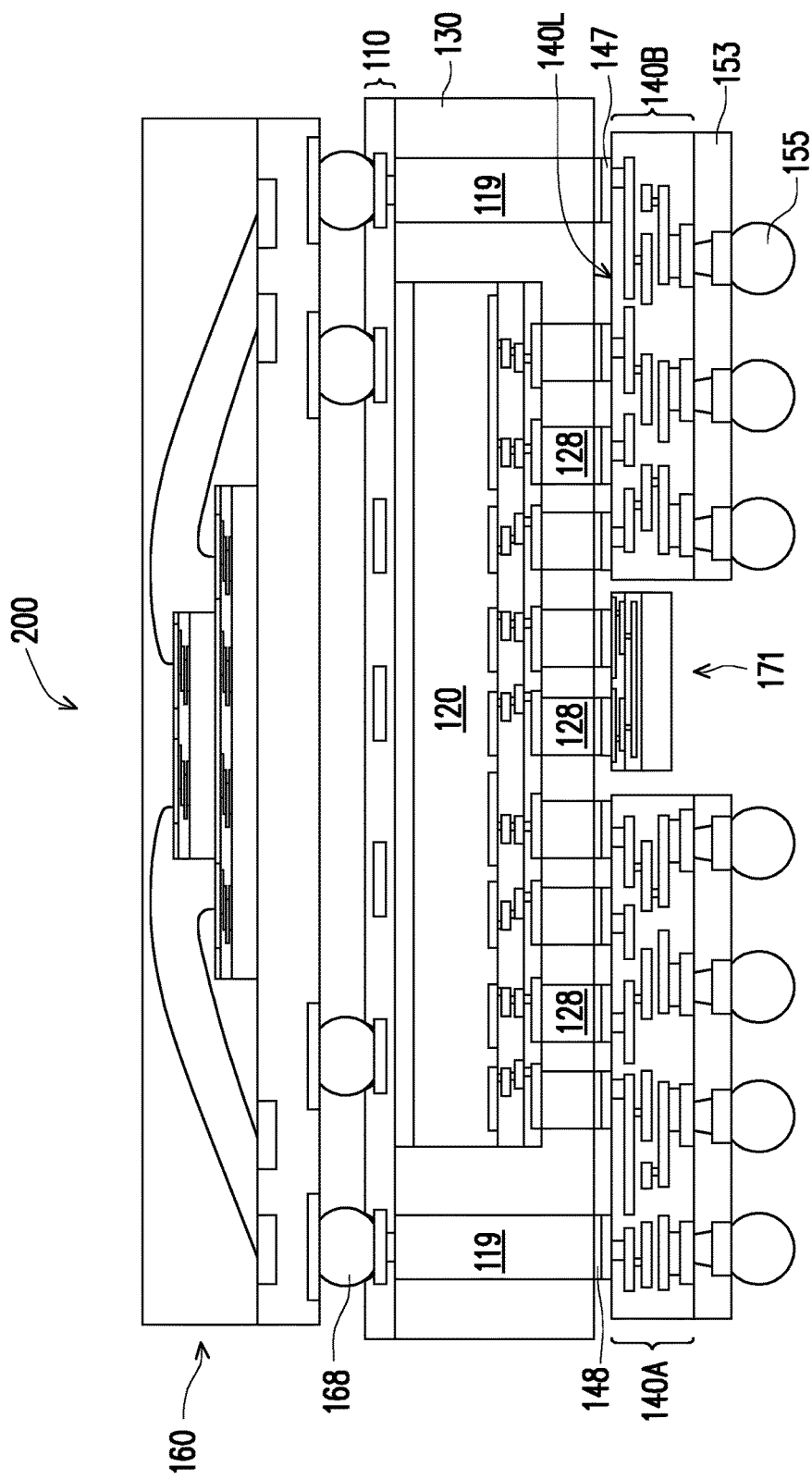

FIGS. 11A, 11B, and 12 illustrate various views (e.g., cross-sectional view and plan view) of a semiconductor package 200 at various stages of fabrication, in accordance with an embodiment. Unless otherwise specified, similar numerals in FIGS. 11A, 11B, and 12 refer to similar parts in FIGS. 1-9. For example, components with the same numerals may be formed of the same or similar material, and may be using the same or similar formation method. For simplicity, details may not be repeated.

Referring first to FIG. 11A, two pre-formed redistribution structures 140A and 140B are attached to a first region 310 of the semiconductor package 200 and a second region 320 of the semiconductor package 200, respectively. FIG. 11B is a plan view of the semiconductor package 200 in FIG. 11A, and FIG. 11A is the cross-sectional view along line B-B of FIG. 11B.

As illustrated in the plan view of FIG. 11B, the redistribution structures 140A and 140B are physically separated from each other, and may have different sizes (e.g., length, width, and area). FIG. 11B further illustrates a third pre-formed redistribution structure 140C, which was not visible in the cross-sectional view of FIG. 11A. As illustrated in FIG. 11B, each of the redistribution structures 140A/140B/140C has a size smaller than a size of the underlying molding material 130 (or a size of the redistribution structure 110). In embodiments where multiple semiconductor packages 200 are formed on the carrier 101, the boundaries of the molding material 130 in FIG. 11B, which overlap the boundaries of the redistribution structure 110 in FIG. 11B, correspond to boundaries of an individual semiconductor package 200 after the dicing process.

Still referring to FIG. 11B, a sum of the areas of the redistribution structures 140A/140B/140C is smaller than the area of the molding material 130. FIG. 11B further illustrates electrical devices 171, such as surface mount devices (SMDs) or integrated passive devices (IPDs), that are attached to the upper surface of the molding material 130, e.g., in region 330 (see FIG. 11A) of the semiconductor package 200.

Referring back to FIG. 11A, the redistribution structures (e.g., 140A, 140B, 140C) are pre-formed on a respective carrier (not shown), using a same or similar formation method as the redistribution structure 140 in FIG. 4. In particular, damascene and/or dual-damascene processes may be used to form the redistribution structure 140A/140B/140C. The redistribution structure 140A/140B/140C are bonded to conductive features (e.g., conductive pillars 119, die connectors 128) in respective regions (e.g., region 310, 320, or 330) of the semiconductor package 200, similar to the processing illustrated in FIGS. 4 and 5A. Solder regions 148 are formed between the redistribution structures 140A/140B/140C and the respective conductive features. Due to the solder regions 148 and the conductive pads 147, there is a gap between the redistribution structures 140A/140B/140C and the molding material 130. In other words, the second side 140L of the redistribution structure (e.g., 140A) is spaced apart from a surface of the molding material 130 facing the redistribution structure (e.g., 140A). FIG. 11A further illustrates the electrical devices 171 bonded (e.g., by solder regions) to die connectors 128 and are disposed between the redistribution structures 140A and 140B.

After being bonded to the semiconductor package 100, the carriers attached to the redistribution structures 140A/140B/140C are de-bonded. Passivation layers 153, UBM structures 151, and external connectors 155 are formed, using a same or similar process as illustrated in FIG. 6.

Next, as illustrated in FIG. 12, a semiconductor package 160 is attached to the redistribution structure 110 through conductive joints 168, using a same or similar processing illustrated in FIGS. 7-9. Although not shown, a dicing processing may be performed after the conductive joints 168 are formed to separate the semiconductor package 200 from other neighboring semiconductor packages (not shown) formed in the same processing steps, thereby forming a plurality of individual semiconductor packages 200.

Figure 13:
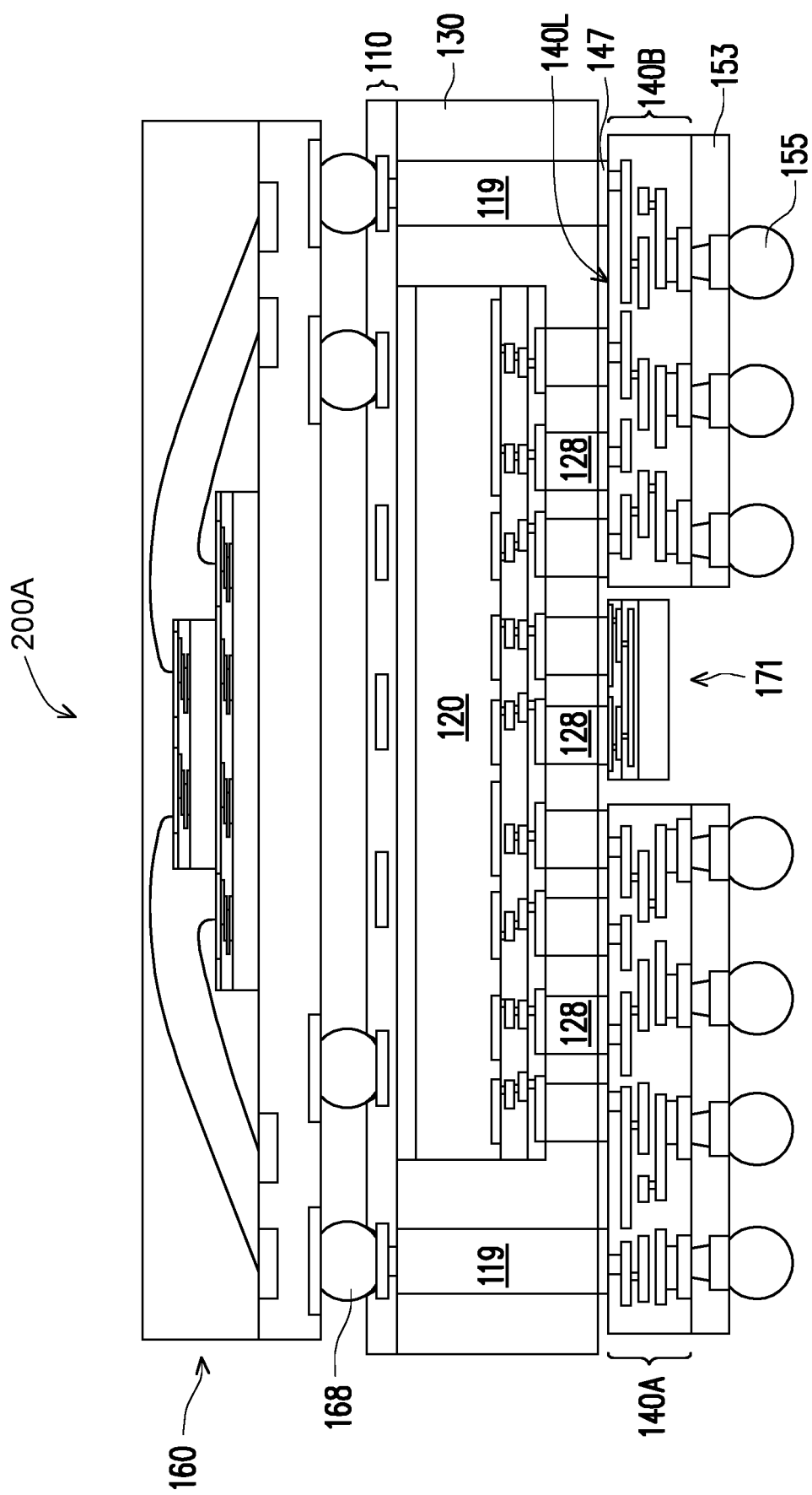
FIG. 13 illustrates a cross-sectional view of a semiconductor package, in accordance with an embodiment.

FIG. 13 illustrates a cross-sectional view of a semiconductor package 200A that is similar to the semiconductor package 200 of FIG. 12, and may be formed using similar processing as illustrated in FIGS. 1-9, but without the solder regions 148 (see FIG. 12) between the redistribution structures (e.g., 140A, 140B, 140C) and the conductive pillars 119/die connectors 128, in some embodiments. Unless otherwise specified, similar numerals in FIG. 13 refer to similar parts in FIG. 12. For example, components with the same numerals may be formed of the same or similar material, and may be formed using the same or similar formation method. For simplicity, details are not repeated.

Referring to FIG. 13, to bond the redistribution structure 140A/140B to the conductive pillars 119/die connectors 128, a direct-bonding process is performed so that the conductive pads 147 (e.g., a copper pad) is directly bonded to the conductive pillar 119 (e.g., a copper pillar) and directly bonded to the die connectors 128 (e.g., copper die connectors). Therefore, there is no solder region between the conductive pads 147 and the conductive pillars 119/die connectors 128. The electric device 171 may be bonded to respective die connectors 128 by solder regions in some embodiments, and in other embodiments, the electrical device 171 may be bonded directly (e.g., using direct-bonding process) to the die connectors 128 without solder regions in between. Due to the conductive pads 147, there is a gap between the redistribution structures 140A/140B and the molding material 130. In other words, the second side 140L of the redistribution structure (e.g., 140A) is spaced apart from a surface of the molding material 130 facing the redistribution structure (e.g., 140A)

Variations of the disclosed embodiments are possible and are fully intended to be included within the scope of the present disclosure. For example, one semiconductor die 120 is used in the various embodiments as non-limiting examples, however, two or more semiconductor dies may be attached to the redistribution structure 110 without departing from the spirit of the present disclosure. As another example, three pre-made redistribution structure 140A/140B/140C are attached to the semiconductor package 200 in FIG. 11B as an example, more or less than three pre-made redistribution structures may be attached to the semiconductor package. As yet another example, although not shown, an underfill material may be formed in the gap between the redistributions structures (e.g., 140, 140A, 140B) and the molding material 130. The underfill material may completely fill the gap in some embodiments, and in other embodiments, the underfill material may be formed around the conductive pads 147 and around the solder regions 148 (if formed) and leave other regions of gap unfilled (e.g., empty).

Embodiments may achieve advantages. For example, the presently disclosed methods allow the redistribution structures (e.g., 140, 140A, 140B) to be pre-formed prior to being attached. This reduces the processing time and increases production throughput. Since the redistribution structure can be pre-formed over a carrier instead of the molding material, the thermal limitation of the molding material is avoided, and damascene and/or dual-damascene process can be used to form the redistribution structures, which results in finer line pitches and smaller vias sizes, thus allowing for high integration density with increased electrical connection reliability. In addition, the presently disclosed method allows for functional testing of the dies before the pre-made redistribution structures are attached, therefore integrated yield is improved by skipping (e.g., not attaching the pre-made redistribution structures to) dies failing the functional test.

Figure 14:
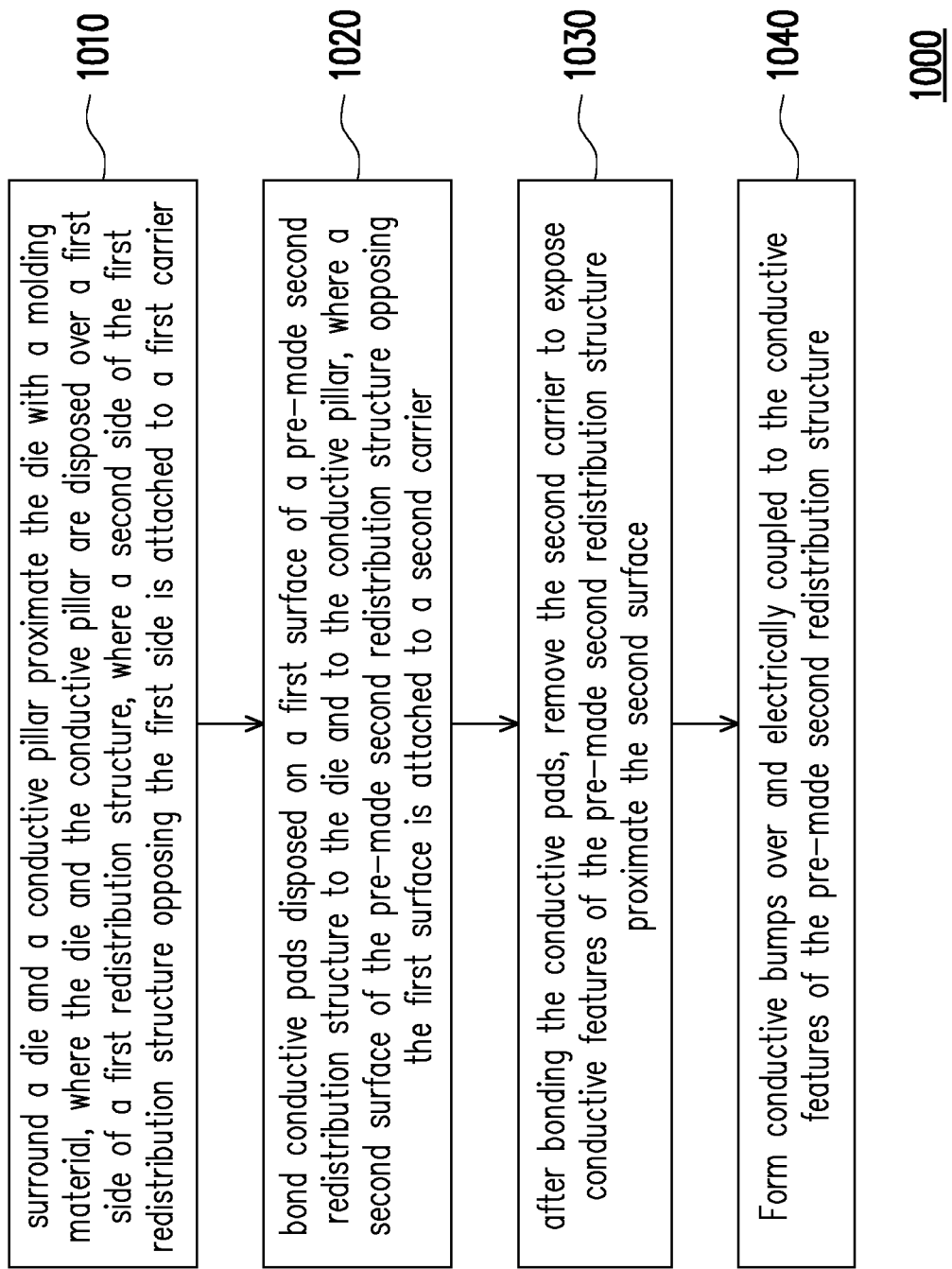
FIG. 14 illustrates a flow chart of a method for forming a semiconductor package, in accordance with some embodiments.

FIG. 14 illustrates a flow chart of a method of fabricating a semiconductor device, in accordance with some embodiments. It should be understood that the embodiment method shown in FIG. 14 is merely an example of many possible embodiment methods. One of ordinary skill in the art would recognize many variations, alternatives, and modifications. For example, various steps as illustrated in FIG. 14 may be added, removed, replaced, rearranged and repeated.

Referring to FIG. 14, at step 1010, a die and a conductive pillar proximate the die are surrounded with a molding material, where the die and the conductive pillar are disposed over a first side of a first redistribution structure, where a second side of the first redistribution structure opposing the first side is attached to a first carrier. At step 1020, conductive pads disposed on a first surface of a pre-made second redistribution structure are bonded to the die and to the conductive pillar, where a second surface of the pre-made second redistribution structure opposing the first surface is attached to a second carrier. At step 1030, after bonding the conductive pads, the second carrier is removed to expose conductive features of the pre-made second redistribution structure proximate the second surface. At step 1040, conductive bumps are formed over and electrically coupled to the conductive features of the pre-made second redistribution structure.

In an embodiment, a method includes forming a first redistribution structure over a first carrier; forming a conductive pillar over the first redistribution structure; attaching a first side of a first die to the first redistribution structure adjacent to the conductive pillar, a second side of the first die facing away from the first redistribution structure, the second side of the first die having die connectors disposed thereon; forming a molding material over the first redistribution structure, the molding material surrounding the first die and the conductive pillar; bonding a first side of a second redistribution structure to the die connectors and to the conductive pillar, a second side of the second redistribution structure opposing the first side of the second redistribution structure being attached to a second carrier; removing the second carrier after bonding the first side of the second redistribution structure to expose conductive features on the second side of the second redistribution structure; and after removing the second carrier, forming conductive bumps on the conductive features on the second side of the second redistribution structure. In an embodiment, the second redistribution structure is pre-made before the bonding. In an embodiment, after the bonding, a top surface of the molding material distal the first redistribution structure is spaced apart from a dielectric layer of the second redistribution structure closest to the molding material. In an embodiment, the bonding comprises bonding conductive pads on the first side of the second redistribution structure to the die connectors and to the conductive pillar. In an embodiment, the conductive pads are bonded to the die connectors and to the conductive pillar by solder joints. In an embodiment, the conductive pads are bonded to the die connectors and to the conductive pillar using a direct-bonding process, where the conductive pads physically contact the die connectors and the conductive pillar after the bonding. In an embodiment, forming the conductive bumps includes after removing the second carrier, forming a passivation layer over the second side of the second redistribution structure; forming under bump metallization (UBM) structures in the passivation layer, the UBM structures being electrically coupled to the conductive features on the second side of the second redistribution structure; and forming the conductive bumps over the UBM structures. In an embodiment, the method further includes removing the first carrier to expose a first side of the first redistribution structure; forming openings in first side of the first redistribution structure, the openings exposing conductive features of the first redistribution structure; and bonding external connectors of a semiconductor device to the exposed conductive features of the first redistribution structure. In an embodiment, in a plan view, a first area of the second redistribution structure is smaller than a second area of the molding material, where the method further includes bonding a first side of a third redistribution structure to the die connectors and to the conductive pillar, a second side of the third redistribution structure opposing the first side of the third redistribution structure being attached to a third carrier; and removing the third carrier after the bonding the first side of the third redistribution structure to expose conductive features on the second side of the third redistribution structure. In an embodiment, in the plan view, a third area of the third redistribution structure is smaller than the second area of the molding material, where a sum of the first area and the third area is smaller than the second area. In an embodiment, the method further includes bonding an electrical device to the die connectors of the first die, where the electrical device is between the second redistribution structure and the third redistribution structure.

In an embodiment, a method includes surrounding a die and a conductive pillar proximate the die with a molding material, where the die and the conductive pillar are disposed over a first side of a first redistribution structure, where a second side of the first redistribution structure opposing the first side is attached to a first carrier; bonding conductive pads disposed on a first surface of a pre-made second redistribution structure to the die and to the conductive pillar, where a second surface of the pre-made second redistribution structure opposing the first surface is attached to a second carrier; after bonding the conductive pads, removing the second carrier to expose conductive features of the pre-made second redistribution structure proximate the second surface; and forming conductive bumps over and electrically coupled to the conductive features of the pre-made second redistribution structure. In an embodiment, a first width of the first redistribution structure is equal to a second width of the molding material, and where a third width of the pre-made second redistribution structure is smaller than the first width. In an embodiment, the method further includes, after bonding the conductive pads and before forming the conductive bumps: forming a passivation layer over the pre-made second redistribution structure; and forming metal features that extends into the passivation layer and are electrically coupled to the conductive features of the pre-made second redistribution structure. In an embodiment, after the bonding, a lowermost surface of the pre-made second redistribution structure facing the die is physically separated from an upper surface of the molding material facing the pre-made second redistribution structure. In an embodiment, the method further includes removing the first carrier; forming openings in the first redistribution structure to expose conductive features of the first redistribution structure; and bonding a semiconductor device to the conductive features of the first redistribution structure.

In an embodiment, a semiconductor package includes a die and a conductive pillar embedded in a molding material; a first redistribution structure on a first side of the die and electrically coupled to the conductive pillar; and a second redistribution structure on a second side of the die opposing the first side, where the die has die connectors on the second side of the die, where the second redistribution structure is electrically coupled to the die connectors and the conductive pillar, and where the second redistribution structure has a second width that is different from a first width of the first redistribution structure. In an embodiment, the semiconductor package further includes solder regions between the die connectors and the second redistribution structure. In an embodiment, the first redistribution structure is conterminous with the molding material, where a width of the second redistribution structure is smaller than a width of the molding material. In an embodiment, a dielectric layer of the second redistribution structure closest to the die is spaced apart from the molding material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
   a die and a first conductive pillar adjacent to the die, the die having die connectors at a front side of the die;
   a molding material around the die and the first conductive pillar;
   a first redistribution structure extending along a backside of the die and electrically coupled to the first conductive pillar; and
   a second redistribution structure extending along the front side of the die, wherein a dielectric layer of the second redistribution structure closest to the die is spaced apart from a first side of the molding material facing the second redistribution structure, wherein the second redistribution structure is electrically coupled to the first conductive pillar and first ones of the die connectors, and wherein the second redistribution structure has a second width different from a first width of the first redistribution structure.

2. The semiconductor package of claim 1, wherein a dielectric layer of the first redistribution structure closest to the die extends along and contacts a second side of the molding material facing the first redistribution structure.

3. The semiconductor package of claim 2, further comprising solder regions between the die connectors and the second redistribution structure.

4. The semiconductor package of claim 2, wherein the first ones of the die connectors are directly bonded to conductive pads of the second redistribution structure without solder regions in between.

5. The semiconductor package of claim 2, wherein sidewalls of the first redistribution structure are aligned with respective sidewalls of the molding material, wherein sidewalls of the second redistribution structure are disposed laterally between the sidewalls of the molding material.

6. The semiconductor package of claim 1, wherein conductive lines in the first redistribution structure have a first line pitch, and conductive lines in the second redistribution structure have a second line pitch smaller than the first line pitch.

7. The semiconductor package of claim 6, wherein the second width is smaller than the first width, wherein the first width and the second width are measured between opposing sidewalls of the first redistribution structure and between opposing sidewalls of the second redistribution structure, respectively.

8. The semiconductor package of claim 7, further comprising:
a second conductive pillar in the molding material and adjacent to the die, the first redistribution structure electrically coupled to the second conductive pillar; and
a third redistribution structure extending along the front side of the die, wherein the third redistribution structure is electrically coupled to the second conductive pillar and second ones of the die connectors, and wherein the third redistribution structure has a third width smaller than the first width of the first redistribution structure.

9. The semiconductor package of claim 8, wherein the first width is larger than a sum of the second width and the third width.

10. The semiconductor package of claim 8, further comprising an electrical device coupled to third ones of the die connectors, wherein the electrical device is disposed between the second redistribution structure and the third redistribution structure.

11. The semiconductor package of claim 10, wherein the second redistribution structure and the third redistribution structure extend further from a first side of the molding material than the electrical device, the first side of the molding material facing the second redistribution structure.

12. A semiconductor package comprising:
a first redistribution structure having a first line pitch;
a die over the first redistribution structure;
conductive pillars over the first redistribution structure adjacent to the die;
a molding material over the first redistribution structure around the die and around the conductive pillars; and
a second redistribution structure over the die, the conductive pillars, and the molding material, the second redistribution structure having a second line pitch smaller than the first line pitch, wherein the first redistribution structure contacts and extends along a first surface of the molding material, wherein the second redistribution structure is spaced apart from a second surface of the molding material opposing the first surface by solder regions.

13. The semiconductor package of claim 12, wherein the first redistribution structure has a first via size, and the second redistribution structure has a second via size smaller than the first via size.

14. The semiconductor package of claim 12, wherein in a top view, the second redistribution structure is disposed within boundaries of the first redistribution structure.

15. A semiconductor package comprising:
a molding material;
a die and conductive pillars embedded in the molding material;
a first redistribution structure extending along a first side of the molding material, wherein the first redistribution structure is electrically coupled to a first conductive pillar of the conductive pillars; and
a second redistribution structure extending along a second side of the molding material opposing the first side, wherein the second redistribution structure is electrically coupled to the first conductive pillar and first die connectors of the die, wherein a dielectric layer of the second redistribution structure closest to the die is spaced apart from the second side of the molding material, wherein a first line pitch of the first redistribution structure is larger than a second line pitch of the second redistribution structure.

16. The semiconductor package of claim 15, wherein in a top view, the second redistribution structure is disposed with a perimeter of the first redistribution structure defined by sidewalls of the first redistribution structure.

17. The semiconductor package of claim 15, wherein the second redistribution structure is spaced apart from the second side of the molding material by solder regions.

18. The semiconductor package of claim 15, wherein conductive pads of the second redistribution structure are bonded directly to the first die connectors of the die.

19. The semiconductor package of claim 15, further comprising a third redistribution structure extending along the second side of the molding material and electrically coupled to second die connectors of the die, wherein the third redistribution structure is laterally adjacent to, and spaced apart from, the second redistribution structure, wherein the third redistribution structure is spaced apart from the second side of the molding material.

20. The semiconductor package of claim 19, further comprising an electrical device disposed between the second redistribution structure and the third redistribution structure, wherein the electrical device is electrically coupled to third die connectors of the die.

* * * * *